United States Patent
Fiedler

[11] Patent Number: 5,726,588
[45] Date of Patent: Mar. 10, 1998

[54] DIFFERENTIAL-TO-CMOS LEVEL CONVERTER HAVING CROSS-OVER VOLTAGE ADJUSTMENT

[75] Inventor: Alan Fiedler, Minneapolis, Minn.

[73] Assignee: LSI Logic Corporation, Milpitas, Calif.

[21] Appl. No.: 698,306

[22] Filed: Aug. 15, 1996

Related U.S. Application Data

[63] Continuation-in-part of Ser. No. 614,403, Mar. 12, 1996.

[51] Int. Cl.[6] .................................................. H03K 17/13
[52] U.S. Cl. .............................. 326/63; 326/21; 326/68; 327/78
[58] Field of Search .................................. 326/21, 33, 63, 326/68, 71–73; 327/52, 73, 78

[56] References Cited

U.S. PATENT DOCUMENTS

| | | | |
|---|---|---|---|
| 3,358,082 | 12/1967 | Helm | 178/50 |
| 3,395,250 | 7/1968 | Lien | 179/15 |
| 3,914,553 | 10/1975 | Melindo et al. | 179/15 |
| 4,027,301 | 5/1977 | Mayer | 340/183 |
| 4,157,458 | 6/1979 | Roche | 179/15 |
| 4,445,215 | 4/1984 | Svendsen | 370/100 |
| 4,728,930 | 3/1988 | Grote et al. | 340/347 |
| 4,750,149 | 6/1988 | Miller | 364/900 |
| 4,901,076 | 2/1990 | Askin et al. | 341/100 |
| 4,965,797 | 10/1990 | Yamane et al. | 370/112 |
| 5,025,257 | 6/1991 | Hartley et al. | 341/101 |
| 5,175,819 | 12/1992 | Le Ngoc | 395/250 |
| 5,182,467 | 1/1993 | Taylor et al. | 307/243 |
| 5,247,652 | 9/1993 | Uda | 395/500 |
| 5,317,214 | 5/1994 | Lewis | 326/21 X |
| 5,349,653 | 9/1994 | Kurokawa et al. | 395/500 |
| 5,426,381 | 6/1995 | Flannagan et al. | 326/66 |
| 5,463,630 | 10/1995 | Tooher | 370/112 |
| 5,526,360 | 6/1996 | Kraft | 371/112 |
| 5,548,241 | 8/1996 | McClure | 327/538 |
| 5,585,743 | 12/1996 | Kenji et al. | 326/73 |
| 5,606,268 | 2/1997 | Van Brunt | 326/68 |
| 5,614,843 | 3/1997 | Mita et al. | 326/73 |

*Primary Examiner*—David R. Hudspeth
*Attorney, Agent, or Firm*—Westman, Champlin & Kelly, P.A.

[57] ABSTRACT

A differential-to-CMOS level converter includes a differential-to-CMOS conversion circuit, first and second buffers and a cross-over adjustment circuit. The conversion circuit has first and second differential input terminals and first and second complementary output terminals. The first buffer has a buffer input coupled to the first complementary output and has a buffer output. The second buffer has a buffer input coupled to the second complementary output and has a buffer output. The cross-over adjustment circuit has first and second voltage measurement inputs coupled to the first and second buffer outputs and has first and second offset current outputs coupled to the first and second buffer inputs, respectively.

14 Claims, 5 Drawing Sheets

5,726,588

DIFFERENTIAL-TO-CMOS LEVEL CONVERTER HAVING CROSS-OVER VOLTAGE ADJUSTMENT

CROSS-REFERENCE TO RELATED APPLICATION

This is a continuation-part of U.S. Ser. No. 08/614,403, filed Mar. 12, 1996 and entitled "High Performance n:1 Multiplexer with Overlap Control of Multi-Phase Clocks."

BACKGROUND OF THE INVENTION

The present invention relates to differential-to-CMOS level converters and, more particularly, to a differential-to-CMOS level converter having a cross-over voltage adjustment.

Differential-to-CMOS level converters are commonly implemented on integrated circuits, such as application specific integrated circuits (ASIC) using complementary-metal-oxide semiconductor (CMOS) technology. In some integrated circuit applications, it is desirable to implement certain circuit functions with differential logic using differential current-steering methods. In addition, it is often desirable to convert a differential signal generated by this differential logic to "rail-to-rail" CMOS levels. One common differential-to-CMOS level converter includes a balanced comparator with differential inputs and complementary CMOS-level outputs. The balanced comparator includes a differential transistor pair for steering current through the pair as a function of the relative polarity of the differential inputs. The complementary CMOS-level outputs are driven by output driver transistors, which pull the outputs to a logic high level or a logic low level as a function of the steered current. As one output is pulled to a logic high level, the other output is pulled to a logic low level.

A drawback of this converter is that it can introduce significant skew in the low-high and high-low transitions (relative to the differential input transition) at the complementary outputs. If the differential input is a clock input, this skew appears as an output clock duty cycle which is significantly offset from an optimum fifty percent duty cycle. Clock signals that are 180 degrees apart in phase preferably cross over at a midpoint between a logic high level and a logic low level. However, due to a difference in the behavior of the output driver transistors for a low-high transition and a high-low transition, the cross-over points can occur at a voltage that is above or below the midpoint. This problem has been solved in the past by using positive feedback within the differential-to-CMOS level converter so as to make the converter as fast as possible and thus set an upper bound to the output duty cycle offset from fifty percent. The problem with this and other approaches is that the degree to which the duty-cycle control can be achieved is limited.

SUMMARY OF THE INVENTION

The differential-to-CMOS level converter of the present invention includes a differential-to-CMOS conversion circuit, first and second buffers and a cross-over adjustment circuit. The conversion circuit has first and second differential input terminals and first and second complementary output terminals. The first buffer has a buffer input coupled to the first complementary output and has a buffer output. The second buffer has a buffer input coupled to the second complementary output and has a buffer output. The cross-over adjustment circuit has first and second voltage measurement inputs coupled to the first and second buffer outputs and has first and second offset current outputs coupled to the first and second buffer inputs, respectively.

In one embodiment the cross-over adjustment circuit includes first and second supply terminals, a reference node, a cross-over voltage measurement circuit, a loop filter capacitor and a differential amplifier. The cross-over voltage measurement circuit includes a pull-up circuit and pull-down circuit. The pull-up circuit is coupled between the first supply terminal and a cross-over adjustment output and is controlled by the first and second voltage measurement inputs. The pull-down circuit is coupled between the cross-over adjustment output and the second supply terminal and is controlled by the first and second voltage measurement inputs. The loop filter capacitor is coupled to the cross-over adjustment output. The differential amplifier has a first amplifier input coupled to the reference node, a second amplifier input coupled to the cross-over adjustment output and first and second amplifier outputs coupled to the first and second offset current outputs, respectively.

The pull-up circuit includes first and second P-channel transistors which are coupled together in series between the first supply terminal and the cross-over adjustment output and which have gates coupled to the first and second voltage measurement inputs, respectively. The pull-down circuit includes first and second N-channel transistors coupled together in series between the cross-over adjustment output and the second supply terminal and having gates coupled to the first and second voltage measurement inputs, respectively.

In a preferred embodiment, the pull-up circuit further includes third and fourth P-channel transistors which are coupled together in series between the first supply terminal and the cross-over adjustment output and which have gates coupled to the second and first measurement inputs, respectively. The pull-down circuit includes third and fourth N-channel transistors which are coupled together in series between the cross-over adjustment output and the second supply terminal and which have gates coupled to the second and first voltage measurement inputs, respectively. This provides a symmetrical output for low-high and high-low transitions in the measurement inputs.

DETAILED DESCRIPTION OF THE PREFERRED EMBODIMENTS

Figure 1:
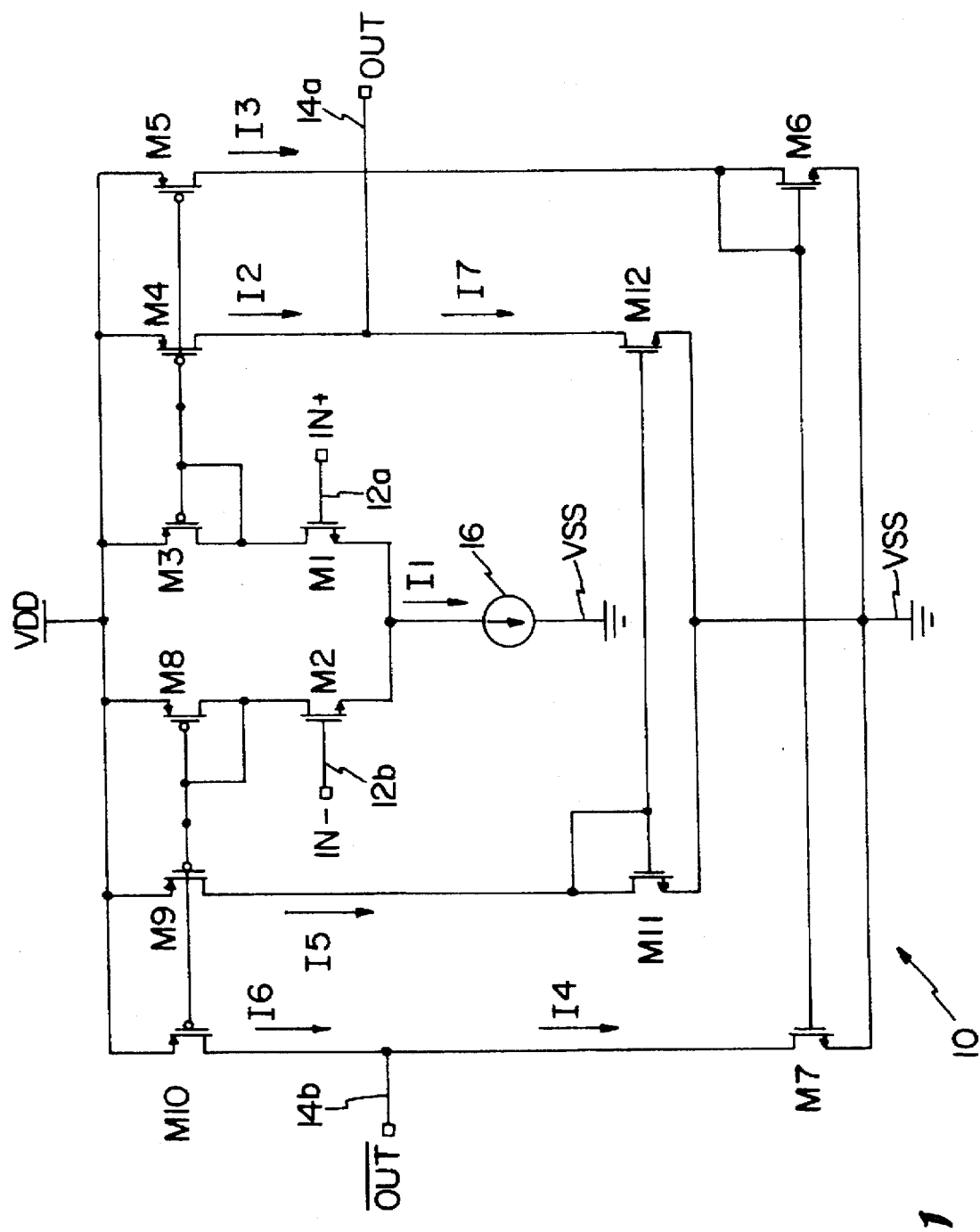
FIG. 1 is a schematic diagram of a differential-to-CMOS level converter of the prior art.

FIG. 1 is a schematic diagram of a common differential-to-CMOS level converter. Differential-to-CMOS level converter 10 is a balanced comparator with differential inputs 12a and 12b and complementary outputs 14a and 14b. Inputs 12a and 12b are coupled to the gates of N-channel transistors M1 and M2 which form a differential transistor pair for steering current I1 through the pair as a function of the relative polarity of the input signals. Current I1 is provided by current source 16 which may be formed by an N-channel transistor which is coupled between the sources of transistors M1 and M2 and voltage supply terminal VSS. Current source 16 is preferably a substantially constant current source.

If the signal applied to input 12a is positive with respect to the signal applied to input 12b, N-channel transistor M1 will be on and N-channel transistor M2 will be off. Current I1 is directed through N-channel transistor M1 and P-channel transistor M3, which is coupled between the drain of N-channel transistor M1 and voltage supply terminal VDD. P-channel transistor M3 is coupled to P-channel transistors M4 and M5 to form a current mirror which mirrors current I1 to the drains of P-channel transistors M4 and M5 as currents I2 and I3. Current I2, which flows through P-channel transistor M4 pulls output 14a to a logic high level. P-channel transistor M5 provides current I3 to N-channel transistor M6. N-channel transistor M6 is coupled to N-channel transistor M7 to form a current mirror which mirrors current I3 to the drain of N-channel transistor M7 as current I4. Current I4 pulls output 14b to a logic low level. Outputs 14a and 14b are thus complementary.

If the signal applied to input 12a is negative with respect to the signal applied to input 12b, N-channel transistor M1 will be off and N-channel transistor M2 will be on. Current I1 is directed through N-channel transistor M2 and P-channel transistor M8, which is coupled between the drain of N-channel transistor M2 and voltage supply terminal VDD. P-channel transistor M8 is coupled to P-channel transistors M9 and M10 to form a current mirror which mirrors current I1 to the drains of P-channel transistors M9 and M10 as currents I5 and I6. Current I6, which flows through P-channel transistor M10, pulls output 14b to logic high level. P-channel transistor M9 provides current I5 to N-channel transistor M11. N-channel transistor M11 is coupled to N-channel transistor M12 to form a current mirror which mirrors current I5 to the drain of N-channel transistor M12 as current I7. Current I7 pulls output 14a to a logic low level.

Figure 2:
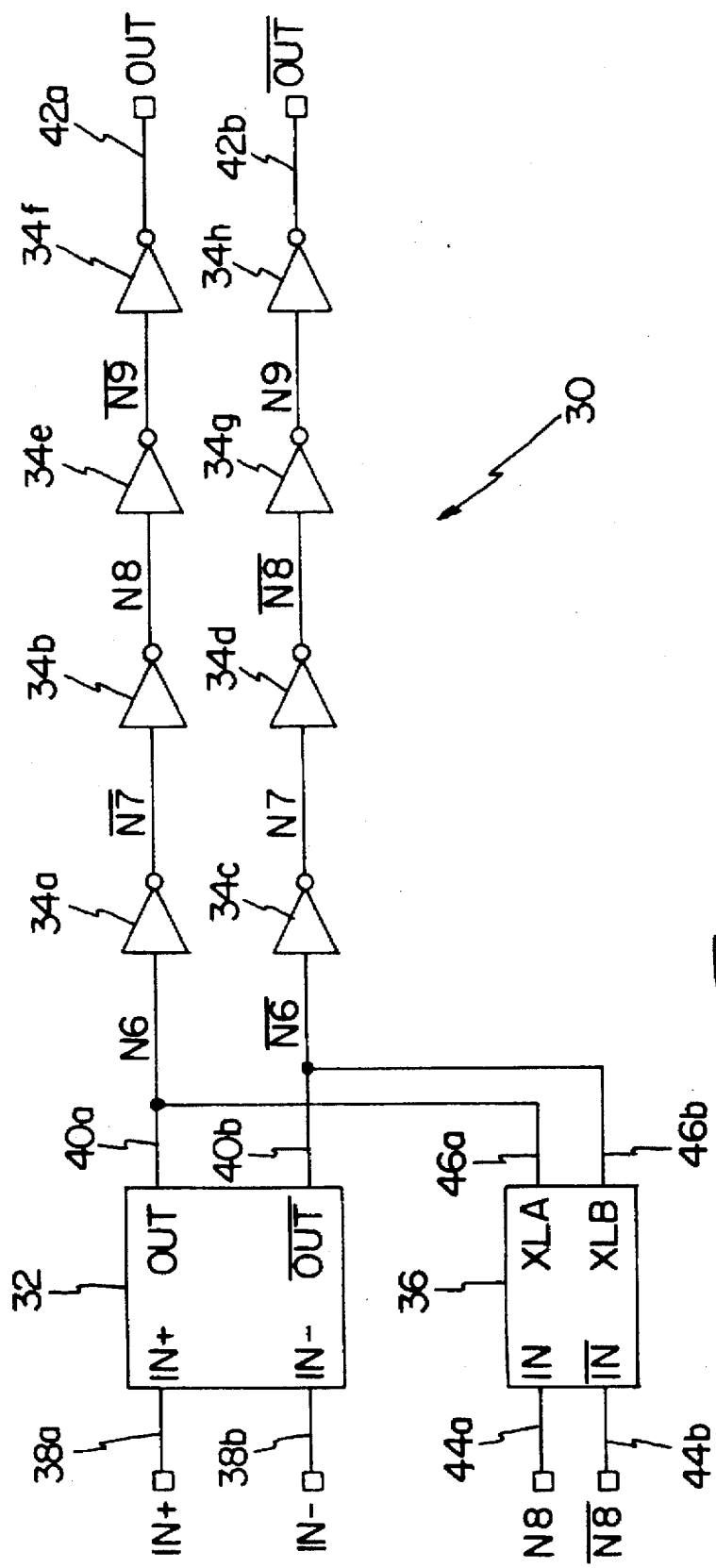
FIG. 2 is a schematic diagram of a differential-to-CMOS level converter of the present invention.

FIG. 2 is a schematic diagram of a differential-to-CMOS level converter having a cross-over adjustment according to the present invention. Differential-to-CMOS level converter 30 includes differential-to-CMOS converter circuit 32, CMOS inverters 34a–34h and cross-over voltage adjustment circuit 36. In one embodiment, converter circuit 32 is substantially the same as differential-to-CMOS level converter 10 shown in FIG. 1. However, converter 10 is only an example of a converter which is suitable for use with the present invention. Other circuit configurations can also be used.

Converter circuit 32 includes differential inputs 38a and 38b and complementary output terminals 40a and 40b. Differential inputs 38a and 38b receive input signals IN+ and IN–, respectively, which are converted to complementary CMOS-level output signals on outputs 40a and 40b. Outputs 40a and 40b are coupled to circuit nodes N6 and $\overline{N6}$, respectively. Inverters 34a and 34b are coupled together in series between circuit node N6 and circuit node N8. Inverters 34a and 34b form a non-inverting buffer. Inverters 34c and 34d are coupled together in series between circuit node $\overline{N6}$ and circuit node $\overline{N8}$. Inverters 3c and 34d also form a non-inverting buffer. Inverters 34e and 34f are coupled together in series between circuit node N8 and complementary output terminal 42a. Inverters 34g and 34h are coupled together in series between circuit node $\overline{N8}$ and complementary output terminal 42b. Inverters 34e, 34f, 34g, and 34h provide additional drive capability for output signals OUT and $\overline{OUT}$ on output terminals 42a and 42b.

Cross-over voltage adjustment circuit 36 includes voltage measurement inputs 44a and 44b and offset current outputs 46a and 46b. Voltage measurement inputs 44a and 44b are coupled to circuit nodes N8 and $\overline{N8}$, respectively. Offset current outputs 46a and 46b are coupled to circuit nodes N6 and $\overline{N6}$, respectively.

Cross-over voltage adjustment circuit 36 monitors the cross-over voltage of the signals on circuit nodes N8 and $\overline{N8}$, compares the cross-over voltage to a reference voltage, and sources or sinks equal offset currents into or from circuit nodes N6 and $\overline{N6}$ in response to the comparison. In a preferred embodiment, the reference voltage is a midpoint voltage between a logic high level (i.e. the level of supply terminal VDD) and a logic low level (i.e. the level of supply terminal VSS), though other reference voltages and means for generating them are also possible. If the cross-over voltage is found to be below the reference voltage, circuit 36 sources equal offset currents into circuit nodes N6 and $\overline{N6}$. If the cross-over voltage is found to be above the reference voltage, circuit 36 sinks equal offset currents from circuit nodes N6 and $\overline{N6}$. This feedback loop reaches an equilibrium when the cross-over voltage of the signals on circuit nodes N8 and $\overline{N8}$ is neither high or nor low. The cross-over voltage is therefore at the optimum level determined by the reference voltage. When the cross-over voltage of the signals on circuit nodes N8 and $\overline{N8}$ is optimum, the cross-over voltage of the output signals OUT and $\overline{OUT}$ on complementary output terminals 42a and 42b is also optimum. For example, when the duty cycle of the differential input signals IN+ and IN– is fifty percent, such as with a clock signal from a differential voltage controlled oscillator, the duty cycle of the output signals OUT and $\overline{OUT}$ on complementary output terminals 42a and 42b will be very nearly fifty percent over any conditions of process, power supply voltage, and temperature.

Figure 3A:
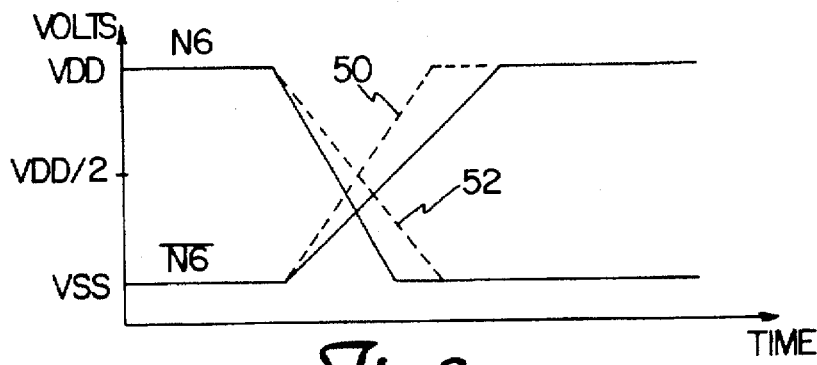
FIGS. 3a-3d are waveform diagrams illustrating complementary outputs which cross over low and high, respectively, with respect to a midpoint voltage.
Figure 3B:
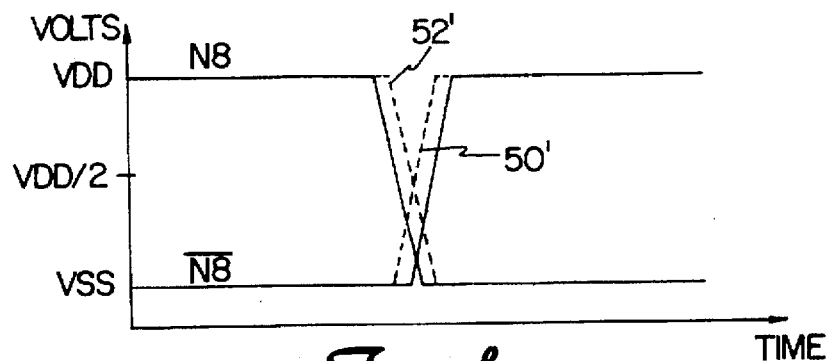

FIGS. 3a and 3b are waveform diagrams illustrating the signals on circuit nodes N6, $\overline{N6}$, N8 and $\overline{N8}$ over time. The signal on circuit node N8 transitions from a logic high level (i.e. VDD) to a logic low level (i.e. VSS) as the signal on circuit node $\overline{N6}$ transitions from the logic high level to the logic low level. The signals on circuit nodes N6 and $\overline{N6}$ cross over one another at a voltage which is below the midpoint (e.g. VDD/2) between the logic high level and the logic low level. The signals on circuit nodes N8 and $\overline{N8}$ therefore also cross over low, but to an enhanced degree due to an amplifying action of inverters 34a–34d.

Cross-over voltage adjustment circuit 36 measures this low cross-over of the signals on circuit nodes N8 and $\overline{N8}$ and sources equal offset currents into circuit nodes N6 and $\overline{N6}$, which adjusts the rise and fall characteristics of the signals on circuit nodes N6 and $\overline{N6}$ as shown by dashed lines 50 and 52, such that the signals on circuit nodes N8 and $\overline{N8}$ cross over at the midpoint, as shown by dashed lines 50' and 52'.

Figure 3C:
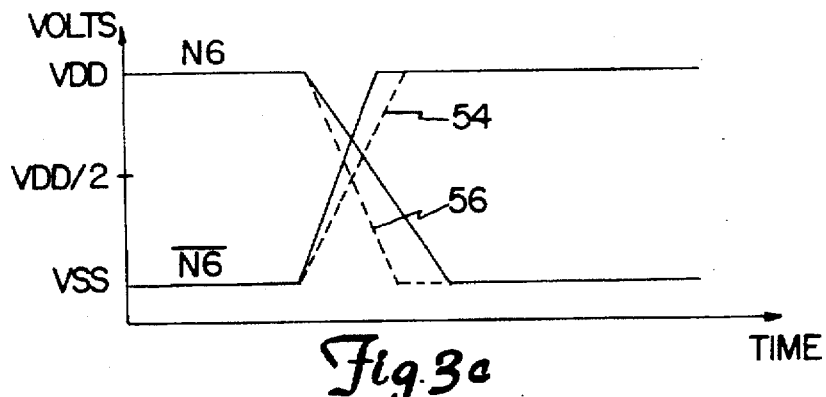
Figure 3D:
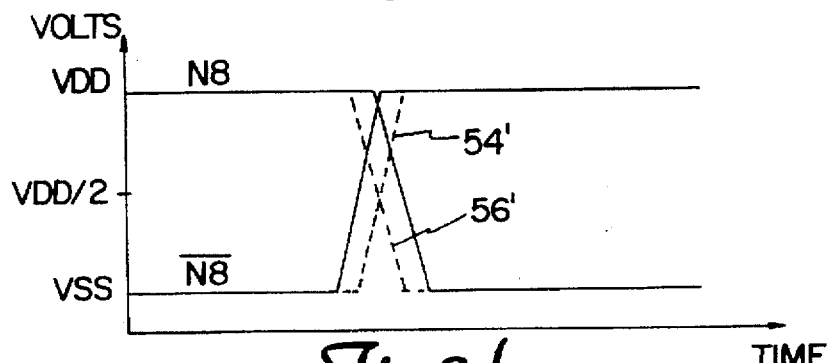

FIG. 3c and 3d are waveform diagrams illustrating the signals on circuit nodes N6, $\overline{N6}$, N8 and $\overline{N8}$ when the signals on circuit nodes N6 and $\overline{N6}$ cross over above the midpoint between the logic high level and the logic low level. The signals on circuit nodes N8 and $\overline{N8}$ therefore also cross over above the midpoint, but to an enhanced degree due to the amplifying action of inverters 34a–34d.

Cross-over voltage adjustment circuit 36 measures this high cross-over of the signals on circuit nodes N8 and $\overline{N8}$ and sinks equal offset currents from circuit nodes N6 and $\overline{N6}$, which adjusts the rise and fall characteristics of the signals on circuit nodes N6 and $\overline{N6}$ as shown by dashed lines 54 and 56, such that the signals on circuit nodes N8 and $\overline{N8}$ cross over at the midpoint, as shown by dashed lines 54' and 56'.

Figure 4:
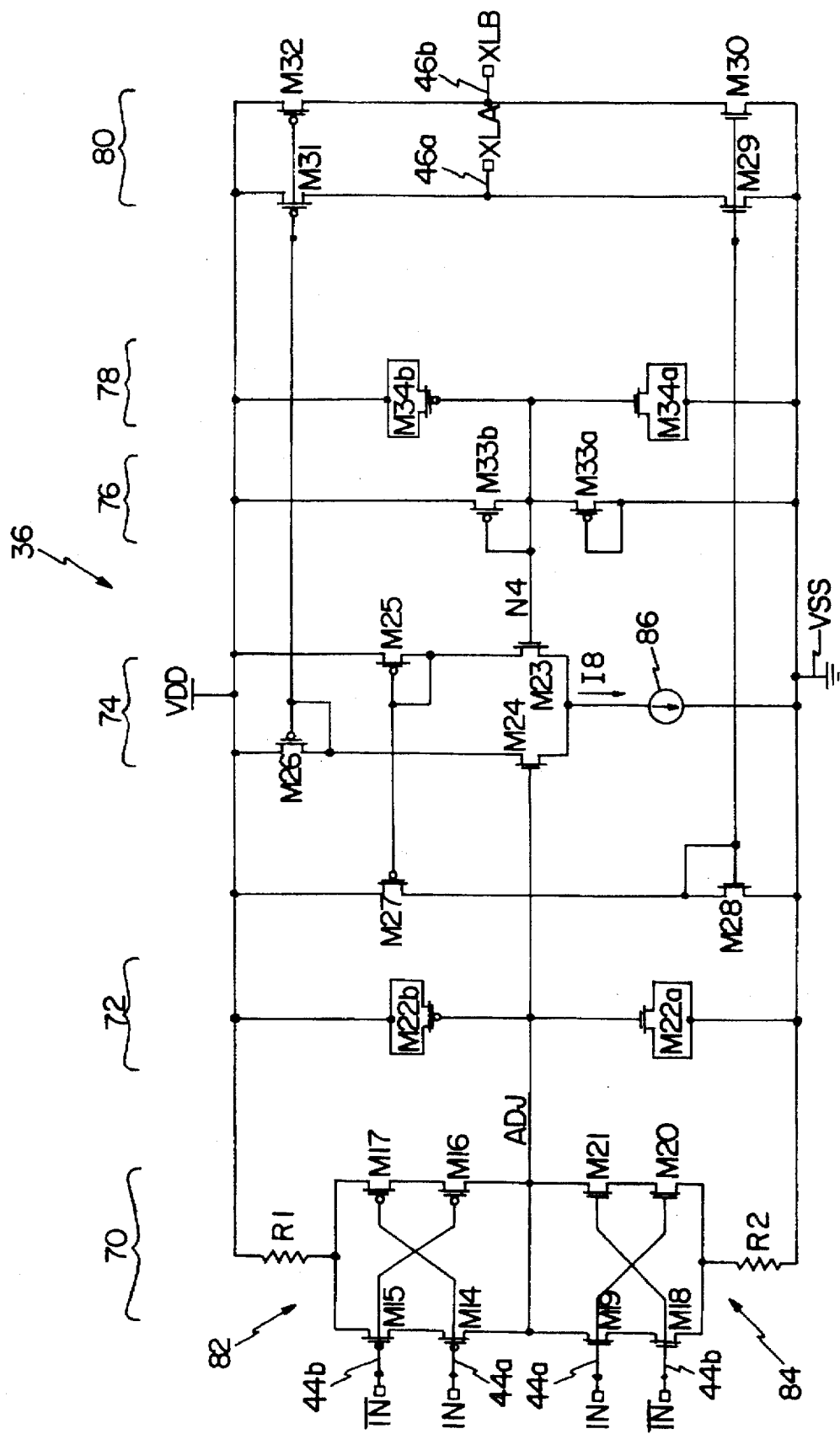
FIG. 4 is a schematic diagram of a cross-over adjustment circuit within the differential-to-CMOS level converter shown in FIG. 2.

FIG. 4 is a schematic diagram which illustrates cross-over voltage adjustment circuit 36 in greater detail. Circuit 36 includes cross-over voltage measurement circuit 70, loop filter capacitor 72, differential amplifier 74, reference voltage generator 76, filter capacitor 78 and output driver 80. Cross-over voltage measurement circuit 70 includes pull-up circuit 82 and pull-down circuit 84. Pull-up circuit 82 includes resistor R1 and P-channel transistors M14–M17. P-channel transistor M14 has a gate coupled to voltage measurement input 44a, a source coupled to the drain of P-channel transistor M15 and a drain coupled to adjustment node ADJ. P-channel transistor M15 has a gate coupled to voltage measurement input 44b and a source coupled to resistor R1. P-channel transistor M16 has a gate coupled to voltage measurement input 44b, a source coupled to the drain of P-channel transistor M17 and a drain coupled to adjustment node ADJ. P-channel transistor M17 has a gate coupled to voltage measurement input 44a and a source coupled to resistor R1. Resistor R1 is coupled between the sources of P-channel transistors M15 and M17 and supply terminal VDD.

Pull-down circuit 84 includes resistor R2 and N-channel transistors M18–M21. Resistor R2 is coupled between supply terminal VSS and the sources of N-channel transistors M18 and M20. N-channel transistor M18 has a gate coupled to voltage measurement input 44b and a drain coupled to the source of N-channel transistor M19. N-channel transistor M19 has a gate coupled to voltage measurement input 44a and drain coupled to adjustment node ADJ. N-channel transistor M20 has a gate coupled to voltage measurement input 44a and a drain coupled to the source of N-channel transistor M21. N-channel transistor M21 has a gate coupled to voltage measurement input 44b and a drain coupled to adjustment node ADJ.

Loop filter capacitor 72 includes N-channel transistor M22a and P-channel transistor M22b. N-channel transistor M22a has a gate coupled to adjustment node ADJ and a source and drain coupled to supply terminal VSS. P-channel transistor M22b has a gate coupled adjustment node ADJ and a source and drain coupled to supply terminal VDD. N-channel transistor M22a and P-channel transistor M22b form loop filter capacitors which store charge applied to adjustment node ADJ. With each transition of the signals on voltage measurement input 44a and 44b, a certain amount of charge is added to or subtracted from filter capacitor 72 at adjustment node ADJ. In steady state, the net change in charge on loop filter capacitor 72 on each transition is zero, and the voltage on adjustment node ADJ is constant.

P-channel transistors M14–M17 detect when the signals applied to voltage measurement inputs 44a and 44b cross over low, and in response add charge to adjustment node ADJ. N-channel transistors M18–M21 detect when the signals applied to voltage measurement inputs 44a and 44b cross over high, and in response remove charge from adjustment node ADJ. For example, when the signal applied to voltage measurement input 44a transitions from a logic high level to a logic low level and the signal applied to voltage measurement input 44b transition from a logic low level to a logic high level, P-channel transistors M14 and M17 are initially off and P-channel transistors M15 and M16 are initially on. Likewise, N-channel transistors M19 and M20 are initially on and N-channel transistors M18 and M21 are initially off. If the signals applied to inputs 44a and 44b cross over low, there will be a time during which the gates of transistors M14–M17 are all low. P-channel transistors M14–M17 will temporarily be on at the same time and will supply charge to adjustment node ADJ. Once the transition is complete, P-channel transistors M15 and M16 turn off while P-channel transistors M14 and M17 remain on.

If the signals applied to input terminals 44a and 44b cross over high, there will be a time during which the gates of N-channel transistors M18–M21 are all high. Therefore, transistors M18–M21 are temporarily on at the same time, which removes charge from adjustment node ADJ. Once the transition is complete, N-channel transistors M19 and M20 turn off, while N-channel transistors M18 and M21 remain on. A similar operation occurs when the signals applied to input terminals 44a and 44b transition from low to high and high to low, respectively.

Differential amplifier 74 includes current source 86, N-channel transistors M23 and M24 and P-channel transistors M25 and M26. Current source 86 is coupled between the sources of N-channel transistors M23 and M24 and supply terminal VSS. N-channel transistor M23 has a gate coupled to reference voltage node N4 and a drain coupled to the gate and drain of P-channel transistor M25. P-channel transistor M25 has a source coupled to supply terminal VDD. N-channel transistor M24 has a gate coupled to adjustment node ADJ and a drain coupled to the gate and drain of P-channel transistor M26. P-channel transistor M26 has a source coupled to supply terminal VDD. N-channel transistors M23 and M24 form a differential transistor pair for steering current 18 through the pair as a function of the relative voltage levels on reference voltage node N4 and adjustment node ADJ.

P-channel transistor M27 is coupled to P-channel transistor M25 to form a current mirror which mirrors the current from the drain of P-channel transistor M25 to the drain of P-channel transistor M27. P-channel transistor M27 has a gate coupled to the gate and a drain of P-channel transistor M25, a source coupled to supply terminal VDD and a drain coupled to the gate and drain N-channel transistor M28. N-channel transistor M28 has a source coupled to supply terminal VSS.

Output driver 80 includes N-channel current sink transistors M29 and M30 and P-channel current source transistors M31 and M32. N-channel current sink transistors M29 and M30 are coupled to N-channel transistor M28 to form a current mirror which mirrors the current at the drain of transistor M28 to the drains of transistors M29 and M30. The gates of N-channel current sink transistors M29 and M30 are coupled to the gate and drain of N-channel transistor M28 and the sources of transistors M29 and M30 are coupled to supply terminal VSS. The drain of N-channel current sink transistor M29 is coupled to offset current output 46a and the drain of N-channel current sink transistor M30 is coupled to offset current output 46b.

P-channel current source transistors M31 and M32 are coupled to P-channel transistor M26 to form a current mirror which mirrors the current at the drain of transistor M26 to the drains of transistors M31 and M32. P-channel current source transistors M31 and M32 have gates coupled to the gate and drain of P-channel transistor M26 and have sources coupled to supply terminal VDD. The drain of P-channel current source transistor M31 is coupled to offset current output 46a and the drain of P-channel current source transistor M32 is coupled to current offset current output 46b.

If the voltage level on adjustment node ADJ is lower than the voltage level on reference node N4, a larger portion of current I8 will be directed through N-channel transistor M23 than N-channel transistor M24. The current flowing through the drain of N-channel transistors M23 and thus the drain of P-channel transistor M25 is mirrored into the drain of P-channel transistor M27. The current flowing through the drain P-channel transistor M27 is provided to the drain of N-channel transistor M28 which is mirrored into the drains of N-channel current sink transistors M29 and M30, which in turn, sink equal currents from offset current outputs 46a and 46b.

If the voltage level on adjustment node ADJ is higher than the voltage level on reference voltage node N4, a larger portion of current I8 will be directed through N-channel transistor M24 than N-channel transistor M23. The current flowing through the drain of N-channel transistor M24 and thus the drain of P-channel transistor M26 is mirrored into the drains of P-channel current source transistors M31 and M32 which source equal currents into offset current outputs 46a and 46b.

Reference voltage generator 76 includes N-channel diode-connected transistor M33a and P-channel diode-connected transistor M33b. Transistor M33a has a gate and drain coupled to supply terminal VSS and a source coupled to reference node N4. P-channel transistor M33b has a gate and drain coupled to reference node N4 and a source coterminal supply terminal VDD. Transistors M33a and M33b operate as a voltage divider which sets the voltage level on reference node N4 to the midpoint between the voltage levels on supply terminals VDD and VSS. Transistors M33a and M33b preferably have the same channel lengths and the same channel widths. However, other reference voltage levels and reference voltage circuits can be used with the present invention.

Filter capacitor 78 includes N-channel transistor M34a and P-channel transistor M34b. N-channel transistor M34a has a gate coupled to reference node N4 and a source and drain coupled to supply terminal VSS. P-channel transistor M34b has a gate coupled to reference node N4 and a source and drain coupled to supply terminal VDD.

Figure 5:
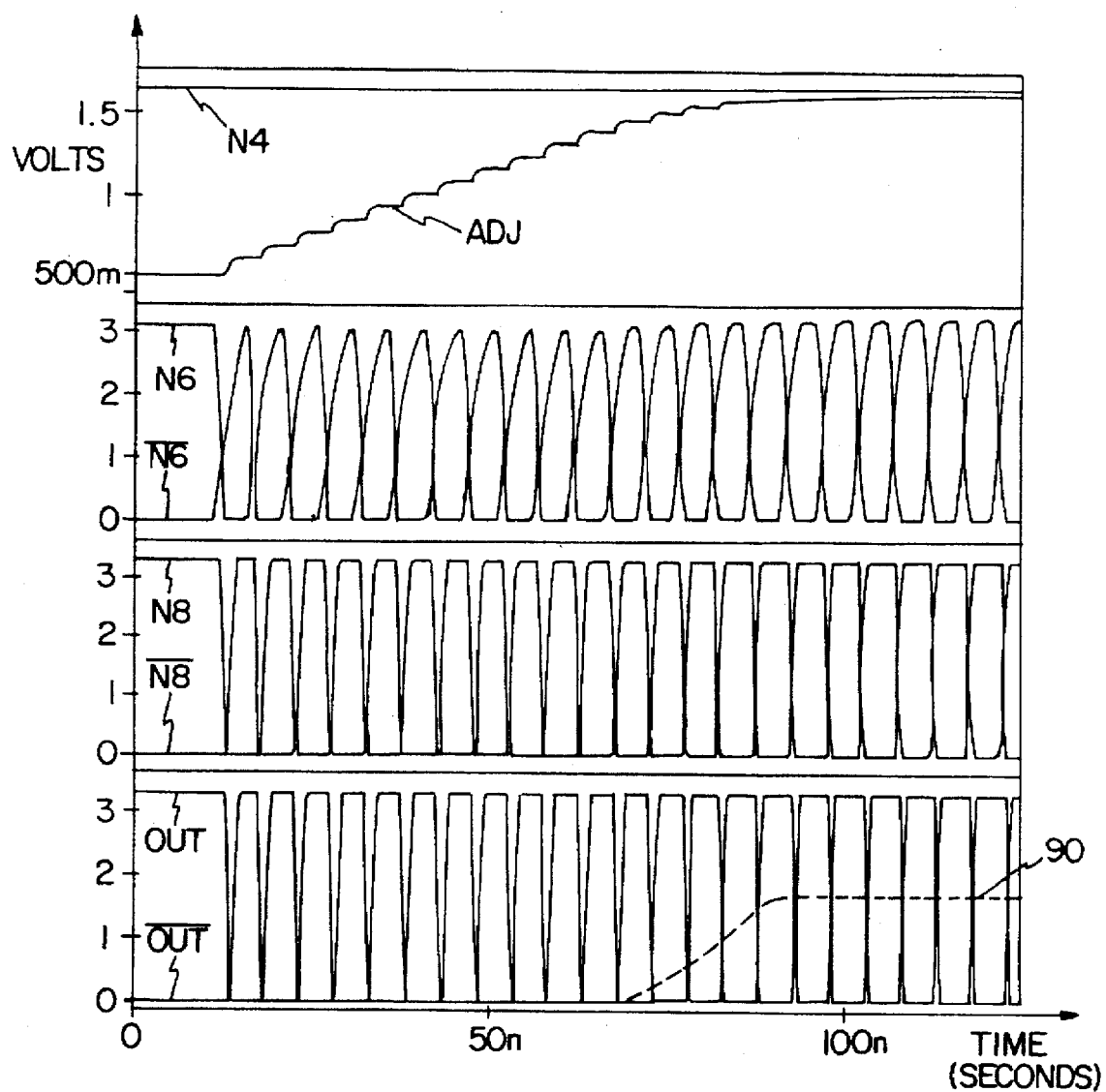
FIG. 5 is a waveform diagram which illustrates a cross-over adjustment output, a reference voltage and a pair of complementary outputs over time according to the present invention.

FIG. 5 is a graph illustrating the voltage levels on adjustment node ADJ, reference node N4, circuit nodes N6, $\overline{N6}$, N8 and $\overline{N8}$, and complementary output terminals 42a and 42b over time. A differential clock signal was applied to input terminals 38a and 38b (shown in FIG. 3). In FIG. 5, the voltage level on adjustment node ADJ is initially low with respect to the voltage level on reference node N4. The output signals OUT and $\overline{OUT}$ on complementary output terminals 42a and 42b toggle back and forth between a logic high level (e.g. 3.3 volts) and a logic low level (e.g. 0 volts). Dashed line 90 is superimposed on output signals OUT and $\overline{OUT}$ to indicate the voltage at which the complementary output signals cross over one another. The output signals OUT and $\overline{OUT}$ initially cross over low at 0 volts.

Since the signals cross over low, transistors M14–M17 (shown in FIG. 4) add charge to adjustment node ADJ on each transition of the input signals IN and $\overline{IN}$. The voltage on adjustment node ADJ incrementally approaches the reference voltage on reference node N4. As the voltage on adjustment node ADJ reaches the reference voltage, the cross-over voltage 90 rises toward the midpoint (e.g. 1.65 volts) between the logic high level and the logic low level, at which point output signals OUT and $\overline{OUT}$ cross over neither high nor low. The circuit settles into a stable operating state and the voltage level on adjustment node ADJ is adjusted neither down nor up. When the input is a differential clock signal having a fifty percent duty cycle, this results in a fifty percent duty cycle at both the true and complement outputs.

Although the present invention has been described with reference to preferred embodiments, workers skilled in the art will recognize that changes may be made in form and detail without departing from the spirit and scope of the invention. For example, any pair of circuit nodes in FIG. 2, such as N6 and $\overline{N6}$, N8 and $\overline{N8}$ or OUT and $\overline{OUT}$, can be coupled to voltage measurement inputs 44a and 44b of cross-over adjustment circuit 36. Also, circuit nodes N7 and N9 and $\overline{N7}$ or N9 and $\overline{N9}$ can be coupled to voltage measurement inputs 44a and 44b, but adjustment node ADJ would have to be coupled to N-channel transistor M23 and reference voltage node N4 would have to be coupled to N-channel transistor M24.

Although the present invention has been described with reference to a particular differential-to-CMOS level converter circuit, other converters or circuit configurations can be used with the present invention. The present invention can be implemented with various technologies other than CMOS technology. The voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level depending on the relative levels of the voltage supply terminals. Likewise, the term "coupled" can include various types of connections or couplings and can include a direct connection or a connection through one or more intermediate components.

What is claimed is:

1. A differential-to-CMOS level converter comprising:
   a conversion circuit having first and second differential inputs and first and second complementary outputs; and
   a cross-over adjustment circuit having first and second cross-over voltage measurement inputs coupled to the first and second complementary outputs and having first and second offset current outputs coupled to the first and second complementary outputs, respectively.

2. The differential-to-CMOS level converter of claim 1 and further comprising:
   a first buffer coupled between the first complementary output and the first cross-over voltage measurement input; and
   a second buffer coupled between the second complementary output and the second cross-over voltage measurement input.

3. The differential-to-CMOS level converter of claim 2 wherein the first and second buffers each comprise first and second CMOS inverters coupled in series with one another.

4. The differential-to-CMOS level converter of claim 1 wherein the cross-over adjustment circuit comprises:
   first and second supply terminals;
   a cross-over voltage reference node;
   a cross-over voltage measurement circuit comprising a pull-up circuit coupled between the first supply terminal and a cross-over adjustment output and controlled by the first and second cross-over voltage measurement inputs, and a pull-down circuit coupled between the cross-over adjustment output the second supply terminal and controlled by the first and second cross-over voltage measurement inputs;
   a loop filter capacitor coupled to the cross-over adjustment output; and
   a differential amplifier having a first amplifier input coupled to the cross-over voltage reference node, a second amplifier input coupled to the cross-over adjustment output and first and second amplifier outputs coupled to the first and second offset current outputs, respectively.

5. The differential-to-CMOS level converter of claim 4 wherein:

the pull-up circuit comprises first and second P-channel transistors coupled together in series between the first supply terminal and the cross-over adjustment output and having gates coupled to the first and second cross-over voltage measurement inputs, respectively; and the pull-down circuit comprises first and second N-channel transistors coupled together in series between the cross-over adjustment output and the second supply terminal and having gates coupled to the first and second cross-over voltage measurement inputs, respectively.

6. The differential-to-CMOS level converter of claim 4 wherein:

the pull-up circuit comprises:

a first P-channel MOSFET having a gate, source and drain, with the gate coupled to the first cross-over voltage measurement input and the drain coupled to the cross-over adjustment output;

a second P-channel MOSFET having a gate, source and drain, with the gate coupled to the second cross-over voltage measurement input and the drain coupled to the source of the first P-channel MOSFET;

a third P-channel MOSFET having a gate, source and drain, with the gate coupled to the second cross-over voltage measurement input and the drain coupled to the cross-over adjustment output;

a fourth P-channel MOSFET having a gate, source and drain, with the gate coupled to the first cross-over voltage measurement input and the drain coupled to the source of the third P-channel MOSFET; and a pull-up resistor coupled between the first supply terminal and the sources of the second and fourth P-channel MOSFETs; and the pull-down circuit comprises:

a first N-channel MOSFET having a gate, source and drain, with the gate coupled to the first cross-over voltage measurement input and the drain coupled to the cress-over adjustment output;

a second N-channel MOSFET having a gate, source and drain, with the gate coupled to the second cross-over voltage measurement input and the drain coupled to the source of the first N-channel MOSFET;

a third N-channel MOSFET having a gate, source and drain, with the gate coupled to the second cress-over voltage measurement input and the drain coupled to the cross-over adjustment output;

a fourth N-channel MOSFET having a gate, source and drain, with the gale coupled to the first cross-over voltage measurement input and the drain coupled to the source of the third N-channel MOSFET; and a pull-down resistor coupled between the sources of the second and fourth N-Channel MOSFETS and the second supply terminal.

7. The differential-to-CMOS level converter of claim 4 wherein the loop capacitor comprises:

a P-channel MOSFET having a gate coupled to the cross-over adjustment output and a source and drain coupled to the first supply terminal; and an N-channel MOSFET having a gate coupled to the cross-over adjustment output and a source and drain coupled to the second supply terminal.

8. The differential-to-CMOS level converter of claim 4 wherein the cross-over adjustment circuit further comprises a voltage reference filter capacitor coupled to the cross-over voltage reference node.

9. The differential-to-CMOS level converter of claim 4 wherein the cross-over adjustment circuit further comprises a first diode-connected transistor coupled between the first supply terminal and the cross-over voltage reference node and a second diode-connected transistor coupled between the cross-over reference voltage node and the second supply terminal.

10. The differential-to-CMOS level converter of claim 4 wherein the differential-to-CMOS level converter further comprises:

a first current sink comprising a first current mirror having an input coupled to the first amplifier output and an output coupled to the first offset current output;

a second current sink comprising a second current mirror having an input coupled to the first amplifier output and an output coupled to the second offset current output;

a first current source comprising a third current mirror having an input coupled to the second amplifier output and an output coupled to the first offset current output; and a second current source comprising a fourth current mirror having an input coupled to the second amplifier output and an output coupled to the second offset current output.

11. The differential-to-CMOS level converter of claim 10 wherein the first and second current mirrors comprise N-channel current mirrors and wherein the converter further comprises:

a fifth current mirror coupled between the first amplifier output and the inputs of the first and second current mirrors, wherein the fifth current mirror comprises a P-channel current mirror.

12. A integrated circuit comprising:

first and second supply terminals;

a differential-to-CMOS converter coupled between the first and second supply terminals and having first and second differential inputs and first and second complementary outputs; and a cross-over adjustment circuit having first and second cross-over voltage measurement inputs coupled to the first and second complementary outputs, respectively, and having first and second offset current outputs coupled to the first and second complementary outputs, respectively.

13. The integrated circuit of claim 12 and further comprising:

a first buffer coupled between the first complementary output and the first cross-over voltage measurement input; and a second buffer coupled between the second complementary output and the second cross-over voltage measurement input.

14. A method of adjusting a cross-over voltage of first and second complementary outputs of a differential-to-CMOS level converter, the method comprising:

generating first and second buffered outputs as a function of the first and second complementary outputs, respectively;

measuring a cross-over voltage of the first and second buffered outputs;

comparing the cross-over voltage to a reference voltage;

sourcing current into the first and second complementary outputs if the cross-over voltage is below the reference voltage; and sinking current from the first and second complementary outputs if the cross-over voltage is above the reference voltage.

* * * * *